US005103190A

United States Patent [19]

Masao

[11] Patent Number: 5,103,190

[45] Date of Patent: Apr. 7, 1992

[54] DRIVING APPARATUS, AND CONTROL INFORMATION STORAGE BODY AND PROTECTION CIRCUIT THEREFOR

[75] Inventor: Masao Noro, of Hamamatsu, Japan

[73] Assignee: Yamaha Corporation, Hamamatsu, Japan

[21] Appl. No.: 585,312

[22] Filed: Sep. 18, 1990

Related U.S. Application Data

[62] Division of Ser. No. 353,444, May 17, 1989.

[30] Foreign Application Priority Data

May 25, 1988 [JP] Japan ............ 63-125637
Jun. 1, 1988 [JP] Japan ............ 63-132606

[51] Int. Cl.[5] ............ H03F 1/52
[52] U.S. Cl. ............ 330/298; 381/121
[58] Field of Search ............ 330/51, 85, 291, 296, 330/297, 298, 207 P; 381/120, 121

[56] References Cited

U.S. PATENT DOCUMENTS

| | | | |
|---|---|---|---|
| 4,236,118 | 11/1980 | Turner | 330/105 |
| 4,388,490 | 6/1983 | Spector | 179/1 |
| 4,821,000 | 4/1989 | Imonishi | 330/298 |
| 4,887,298 | 12/1908 | Haigler | 330/207 P X |

FOREIGN PATENT DOCUMENTS

| | | |
|---|---|---|
| 0011025 | 5/1980 | European Pat. Off. . |
| 0361444 | 4/1990 | European Pat. Off. . |

OTHER PUBLICATIONS

"It's Positive Feedback", by Warner Clements, Audio Engineering, May 1952, pp. 20, 57–59.

*Primary Examiner*—Steven A. Mottola
*Attorney, Agent, or Firm*—Spensley Horn Jubas & Lubitz

[57] ABSTRACT

A driving apparatus for driving an electro-acoustic transducer has a main body portion and a control information storage body which is arranged independently of the main body portion and is selectively separated from or coupled to the main body portion, as needed. The control information storage body stores a real circuit or information for setting electrical characteristics of the driving apparatus. In addition, the driving apparatus has a protection circuit for preventing a disadvantageous result of the driving apparatus and a load caused by an unstable operation and the like when the control information storage body is attached/detached to/from the main body portion or when an inappropriate control information storage body is loaded onto the main body portion.

2 Claims, 12 Drawing Sheets

SPEAKER CHARACTERISTICS

BOOST

DRIVING APPARATUS, AND CONTROL INFORMATION STORAGE BODY AND PROTECTION CIRCUIT THEREFOR

This application is a divisional of Ser. No. 353,444 filed May 17, 1989.

BACKGROUND OF THE INVENTION

1. Field of the Invention

The present invention relates to a driving apparatus which drives an electro-acoustic transducer such as a speaker unit constituting a speaker system so that output characteristics of the transducer are improved and which can cope with, or be made suitable to, a plurality of types of systems, and further relates to a control information storage body for easily changing or setting drive characteristics of the driving apparatus, and to a protection circuit for protecting the circuit and the load of the driving apparatus from an erroneous operation and for preventing noise which are caused by separation/coupling of the control information storage body and a main body.

2. Description of the Prior Art

As a conventional driving apparatus for driving a speaker unit assembled in a speaker system, a power amplifier whose output impedance is substantially zero is generally used. A conventional speaker system is arranged to exhibit optimal acoustic output characteristics when it is constant-voltage driven by such a power amplifier whose output impedance is substantially zero.

FIG. 15 is a sectional view of a conventional closed type speaker system. As shown in the Figure, a hole is formed in the front surface of a closed cabinet 1, and a dynamic speaker unit 3 having a diaphragm 2 is mounted in this hole.

A resonance frequency $f_{oc}$ of this closed type speaker system is expressed by:

$$f_{oc}=f_o(1+S_c/S_o)^{\frac{1}{2}} \quad (1)$$

A Q value $Q_{oc}$ of this speaker system is expressed by:

$$Q_{oc}=Q_o(1+S_c/S_o)^{\frac{1}{2}} \quad (2)$$

where $f_o$ and $Q_o$ are respectively the lowest resonance frequency and Q value of the dynamic speaker unit 3, i.e., the resonance frequency and Q value when this speaker unit 3 is attached to an infinite plane baffle. $S_o$ is the equivalent stiffness of a vibration system, and $S_c$ is the equivalent stiffness of the cabinet 1.

In the closed type speaker system, the resonance frequency $f_{oc}$ serves as a standard of a bass sound reproduction limit of a uniform reproduction range, i.e., a lowest reproduction frequency. The Q value $Q_{oc}$ relate to a reproduction characteristic curve around the resonance frequency $f_{oc}$. If the Q value $Q_{oc}$ is too large, the characteristic curve becomes too sharp around $f_{oc}$. If the Q value $Q_{oc}$ is too small, the characteristic curve becomes too moderate. In either case, the flatness of the frequency characteristics is impaired. The Q value $Q_{oc}$ is normally set to be about 0.8 to 1.

FIG. 16 is a sectional view showing an arrangement of a conventional phase-inversion type (bass-reflex type) speaker system. In the speaker system shown in the Figure, a hole is formed in the front surface of a cabinet 1, and a dynamic speaker unit 3 having a diaphragm 2 is mounted in the hole. A resonance port (bass-reflex port) 8 having a sound path 7 is arranged below the speaker unit 3. The resonance port 8 and the cabinet 1 form a Helmholtz resonator. In this Helmholtz resonator, an air resonance phenomenon occurs due to an air spring in the cabinet 1 as a closed cavity and an air mass in the sound path 7. A resonance frequency $f_{op}$ is given by:

$$f_{op}=c(A/lV)^{\frac{1}{2}}/2\pi \quad (3)$$

where c is the velocity of sound, A is the sectional area of the sound path 7, l is the length of the sound path 7, and V is the volume of the cabinet 1. In a conventional bass-reflex type speaker system according to a standard setting, such a resonance frequency $f_{op}$ is set to be slightly lower than the lowest resonance frequency $f_o$§($\approx f_{oc}$) of the speaker unit 3 which is assembled in the bass-reflex type cabinet 1. At a frequency higher than the resonance frequency $f_{op}$, the sound pressure from the rear surface of the diaphragm 2 inverts its phase oppositely in the sound path 7, whereby the direct radiation sound from the front surface of the diaphragm 2 and the sound from the resonance port 8 are in-phase in front of the cabinet 1, thus constituting an in-phase addition to increase the sound pressure. As a result of the in-phase addition, the lowest resonance frequency of the whole system is lowered to the resonance frequency $f_{op}$ of the resonator. According to an optimally designed bass-reflex type speaker system, the frequency characteristics of an output sound pressure can be expanded even to below the lowest resonance frequency $f_o$§ of the speaker unit 3. As indicated by an alternate one long and two short dashed line in FIG. 17, a uniform reproduction range can be extended wider than those of the infinite plane baffle (indicated by a solid line) and the closed baffle (indicated by an alternate long and short dashed line).

In equations (1) and (2), the equivalent stiffness $S_c$ is inversely proportional to a volume V of the cabinet 1. Therefore, when the speaker system shown in FIG. 15 or 16 is constant-voltage driven, its frequency characteristics, in particular, low-frequency characteristics are influenced by the volume V of the cabinet 1. Thus, it is difficult to make the cabinet 1 and the speaker system compact without impairing the low-frequency characteristics.

For example, in order to compensate for bass-tone reproduction capacity decreased due to a reduction in size of the cabinet, as shown in FIGS. 18(*a*) to 18(*d*), a system of boosting a bass tone by a tone control, a graphic equalizer, a special-purpose equalizer, or the like of a driving amplifier can be employed. In this system, a sound pressure is increased by increasing an input voltage with respect to a frequency range below $f_{oc}$ which is difficult to reproduce. With this system, the sound pressure can be increased at frequencies below $f_{oc}$. However, adverse influences caused by high $Q_{oc}$, such as poor transient response at $f_{oc}$ caused by $Q_{oc}$ which is increased due to a compact cabinet, an abrupt change in phase at $f_{oc}$ due to high $Q_{oc}$, and the like, cannot be completely eliminated. Therefore, the sound pressure of a bass tone is merely increased, and sound quality equivalent to that of a speaker system which uses a cabinet having an optimal volume V and appropriate $f_{oc}$ and $Q_{oc}$ cannot be obtained.

Furthermore, in the base-reflex speaker system shown in FIG. 16, if flat frequency characteristics upon constant-voltage driving are to be obtained, for example, the Q value $Q_{oc}'$ of the speaker unit 3 assembled in the bass-reflex cabinet is set to be $Q_{oc}'=1/\sqrt{3}$, and the resonance frequency $f_{oc}'$ is set to be $f_{oc}'=f_{oc}/\sqrt{2}$. In this manner, characteristics values ($f_o$ and $Q_o$) of the speaker unit 3, the volume V of the cabinet 1, and dimensions (A and l) of a resonance port 8 must be matched with high precision, resulting in many design limitations. $Q_{oc}'$ and $f_{oc}'$ can be approximated by $Q_{oc}$ and $f_{oc}$ in equation (1) and (2).

FIG. 19 shows a negative impedance generator disclosed in U.S. patent application Ser. No. 286,869 previously filed by the same assignee. According to a driver system using the negative impedance generator (to be referred to as negative resistance driving system hereinafter) as a driving apparatus for a speaker system and causing an output impedance to include a negative resistance $-R_0$ to eliminate or invalidate the voice call resistance $R_V$ of a speaker, the $Q_{oc}$ and $Q_{oc}'$ can be decreased and $Q_{op}$ can be increased as compared to those when the speaker is constant-voltage driven by the power amplifier having an output impedance of zero. Thus, the speaker system can be rendered compact, and acoustic output characteristics can be improved.

However, a commercially available amplifier to which the negative resistance driving system of said prior application is applied has a one-to-one correspondence with a speaker system. Thus, one amplifier cannot be used for driving a plurality of types of speaker systems.

The reason for this is as follows. In the negative resistance driving method, the negative resistance value $-R_0$ must satisfy $R_0<R_V$ with respect to the voice coil resistance $R_V$ in order to avoid an oscillation caused by excessive positive feedback. Since frequency characteristics of an output sound pressure from the speaker system driven in accordance with this negative resistance value $-R_0$ change, a change in frequency characteristics must be compensated for an addition to control of the negative resistance value $-R_0$. However, in a current audio system, characteristics of an electrical circuit constituted by a pre-amplifier, a power amplifier and the like are often adjusted in accordance with a combination of the power amplifier and the speaker system, an installation environment, and a kind of music to be played. Such an adjustment may be performed by tone control or a graphic equalizer or the like. However, it is relatively difficult for many users to optimally adjust even only frequency characteristics. Therefore, it is almost impossible for many users to optimally perform both control of the negative resistance value $-R_0$, and compensation and setting of a change in frequency characteristics. For the above-mentioned reasons, the amplifier of the negative resistance driving system of the prior application, which has a one-to-one correspondence with a speaker system, is commercially available.

SUMMARY OF THE INVENTION

It is a first object of the present invention to provide a driving apparatus which can drive an electro-acoustic transducer while improving output characteristics of the transducer, and can easily cope with, or be made suitable to, a plurality of types of transducers, and a control information storage body used to allow the driving apparatus to cope with the plurality of types of transducers.

In order to achieve the above object, a driving apparatus according to a first aspect of the present invention comprises a driver for driving an electro-acoustic transducer so as to cancel a counteraction from surrounding portions with respect to a vibrating body of the transducer by feeding back an input or output of the transducer, and in this driver, a portion for storing control information corresponding to various transducers is separated, and is arranged as a control information storage body.

The driving apparatus with the above arrangement drives the electro-acoustic transducer to cancel a counteraction from surrounding portions with respect to the vibrating body of the transducer. As the driving apparatus, a known circuit such as a negative impedance generator for equivalently generating a negative impedance component ($-Z_0$) in the output impedance, a motional feedback (MFB) circuit for detecting a motional signal corresponding to a movement of a vibrating body (e.g., a diaphragm 2 in FIG. 15) by any method and negatively feeding back the signal to the input side, and the like, can be adopted In this manner, when the electro-acoustic transducer is driven to cancel a counteraction from surrounding portions with respect to the vibrating body of the transducer, the drawbacks in the conventional bass-reflex speaker system can be eliminated, as has been described above with reference to the prior application apparatus shown in FIG. 19.

More specifically, a case will be described wherein the present invention is applied to a speaker system with a resonance port resembling in shape the bass-reflex speaker system shown in FIG. 16. In this case, $Q_{oc}'$ by an equivalent stiffness $S_c$ of a cabinet and a unit resonance system ($S_o$ and $m_o$) is decreased to be small or to zero, so that a diaphragm can be driven in a highly damped state, and sound quality can be improved while suppressing a peak at a frequency $f_{oc}'$ of an apparatus with a compact cabinet shown in FIG. 18. $Q_{op}$ can be set to be a relatively large value regardless of $Q_{oc}'$ described above, and a uniform reproduction range, in particular, low-frequency characteristics can be improved in addition to reduction in size of the speaker system. The closed type speaker system shown in FIG. 15 is in a state wherein a sectional area A of resonance port of the bass-reflex speaker system becomes 0, i.e., an equivalent mass $m_p$ of a resonance port is $\infty$. Therefore, when the closed type speaker system is driven by the driving apparatus of the present invention, $Q_{oc}$ can be decreased or become zero. Thus, in combination with an increase/decrease in input signal level of the driving apparatus, a lowest reproduction frequency can be decreased, and sound quality can be improved. In addition, a cabinet can be rendered compact without impairing acoustic output characteristics.

In the first aspect, a portion to be adjusted in accordance with types of electro-acoustic transducers is separated from a main body portion to serve as a control information storage body. The storage body is selected in correspondence with an electro-acoustic transducer to be driven by the driving apparatus of the present invention, and is set to the main body portion, so that an optimal output impedance and the like for a transducer to be driven can be set. Equalizer characteristics can also be set by the storage body as needed.

According to the first aspect, a normal user need only select a control information storage body corresponding to a transducer to be driven by the driving apparatus and couple the selected body to the driving apparatus, so that characteristic values, e.g., an output impedance, and the like of this driving apparatus can be easily and reliably set to be optimal values.

Since the driving apparatus of the first aspect can correspond to a plurality of types of transducers by replacing control information storage bodies, a user can select a desired one of a plurality of types of transducers. In addition, when a transducer is exchanged, a user need only purchase a control information storage body, and can use the main body portion of the driving apparatus, resulting in low cost investment.

A normal equalizer mainly controls frequency characteristics. However, in the present invention, since a feedback amount of a motional component is controlled, a Q value can be positively controlled.

As described above, the driving apparatus for driving the electro-acoustic transducer (speaker unit) is divided into the control information storage body constituted by a portion for setting electrical characteristics of the driving apparatus, and a driving apparatus main body constituted by the remaining portions, so that the control information storage body and the main body can be separated and coupled, as needed. Thus, a user can couple a control information storage body prepared in advance to the main body in accordance with types of speaker systems, a kind of music to be played, and the like, so that the driving apparatus can be easily set to have optimal electrical characteristics corresponding to the speaker system or the kind of music to be played.

However, for the purpose of changing characteristics of the acoustic apparatus as a combination of the driving apparatus and the speaker system, when a portion of a circuit of the apparatus is constituted as an exchangeable cartridge like the above-mentioned control information storage body, noise (connection noise) is generated when the control information storage body or the cartridge is connected/disconnected. When an input/output signal to/from the cartridge is a digital signal, digital equipment is originally designed in view of generation of an error, and a system for automatically muting or interpolating a signal when a signal is disconnected or large noise is added is known. When such a system is employed, noise can be removed. However, when the cartridge directly receives and outputs an analog signal such as an audio signal, the connection noise is mixed in a signal unless any countermeasures are taken, and is output as an acoustic wave (noise).

In the apparatus in which the portion of the circuit is constituted as a cartridge, the presence/absence of the cartridge should be detected. For example, when electrical characteristics of the apparatus are set by negative feedback, if a cartridge storing a circuit for negative feedback is separated, an amplifier of the main body is in a non-feedback state, and a noise component is amplified at a large gain (open gain) and is output, or the amplifier is oscillated to generate an output in an ultrasonic range, so that circuit elements or loads are heated, damaged, or broken before a user notices it.

Note that many conventional amplifiers are provided with a muting circuit for inhibiting an output for a predetermined period of time immediately after power-on so as to prevent noise in an unstable operation state in a transient period immediately after power-on, or a DC protection circuit for, when a DC voltage appears at an output terminal due to a malfunction, detecting the DC voltage and cutting off an output so as to protect a circuit or load.

It is a second object of the present invention to provide a protection circuit, used in a driving apparatus which has a DC protection circuit, is divided into a control information storage body constituted by a portion for setting electrical characteristics of the driving apparatus and a driving apparatus main body constituted by the remaining portions, and can desirably separate and couple the control information storage body and the main body, for preventing noise upon coupling from being output as an acoustic wave, and for protecting a circuit and a load from an abnormal operation such as oscillation during separation of the control information storage body from the main body or noise or an erroneous operation caused by a transient operation immediately after coupling.

In order to achieve the above object, according to a second aspect of the present invention, circuit elements are separately arranged in the driving apparatus main body and the control information storage body. When the main body and the storage body are separated from each other, some of these circuit elements form a DC bias circuit for applying a DC voltage to an input of the DC protection circuit. When the main body and the storage body are coupled to each other, all the separately arranged circuit elements, some connection terminals of the storage body, and corresponding terminals of the main body form a power supply voltage dividing circuit for applying a voltage of substantially zero to the input of the DC protection circuit in place of said DC bias circuit.

Therefore, according to the second aspect of the present invention, when the main body and the storage body are separated from each other, since a DC voltage is added to the input of the DC protection circuit, the DC protection circuit detects this DC voltage to cut off the output of the driving apparatus. On the other hand, when the main body and the storage body are coupled to each other, since a voltage added from the protection circuit of the present invention to the input of the DC protection circuit is substantially zero, if the driving apparatus is in a normal operation state, the output of the driving apparatus is supplied to a load, e.g., a speaker.

In this manner, according to the second aspect, a separation/coupling state of the control information storage body is detected, so that in a separated state, the output from the driving apparatus main body is cut off, and during normal operation in a coupled state, the output from the driving apparatus main body is allowed. For this reason, the connection noise upon coupling of the control information storage body or noise and an abnormal output caused by an abnormality or erroneous operation during a transient operation immediately after coupling and during separation can be cut off, and discomfort caused by noise generated as an acoustic wave can be avoided. In addition, a circuit and load can be prevented from being heated, degraded, and broken due to the noise and abnormal output.

A method of detecting the presence/absence of the control information storage body, i.e., a cartridge includes a method of using a connection terminal of the cartridge, e.g., a contact of a connector, and a method of detecting it using an additional switch. If the additional switch is used, this poses problems of precision, and the like, resulting in poor reliability. In the present invention, the presence/absence of the cartridge is detected using the contact itself of the connector, thus achieving reliable detection.

In the second aspect, the DC protection circuit originally arranged in audio equipment to protect a speaker and a circuit is utilized for protection against separation/coupling of the control information storage body. Thus, a circuit arrangement is simple.

In this aspect, a constant circuit or circuit arrangement associated with the power supply voltage dividing circuit is changed in accordance with the type of named body utilized, so that only a control information storage body which matches the main body may be coupled and thereby accept the output of the driving apparatus.

DETAILED DESCRIPTION OF THE PREFERRED EMBODIMENTS

Preferred embodiments of the present invention will now be described with reference to the accompanying drawings.

First Embodiment

Figure 1:
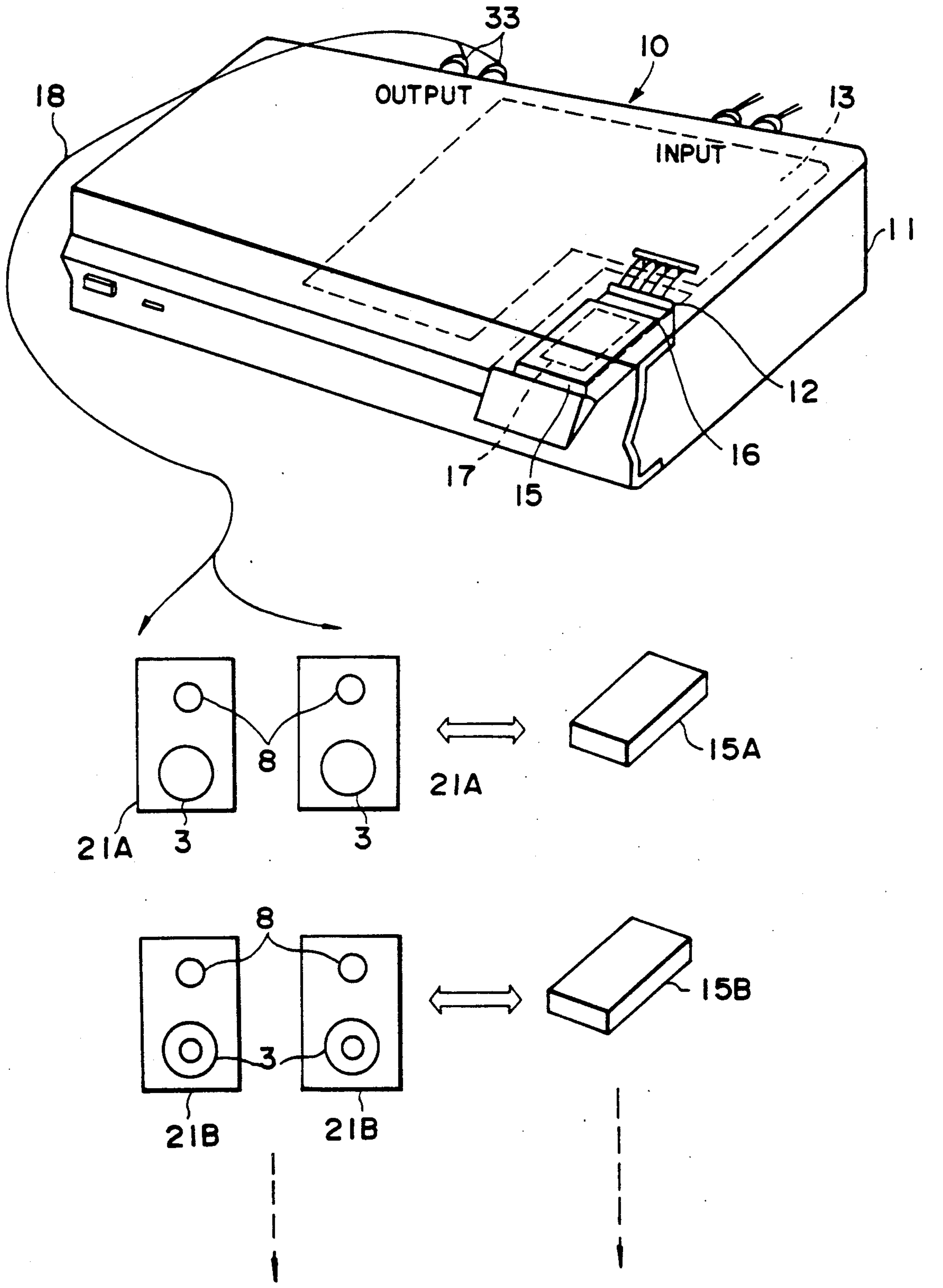
FIG. 1 is a perspective view showing an outer appearance of a basic arrangement of a driving apparatus according to a first embodiment of the present invention.
Figure 2:
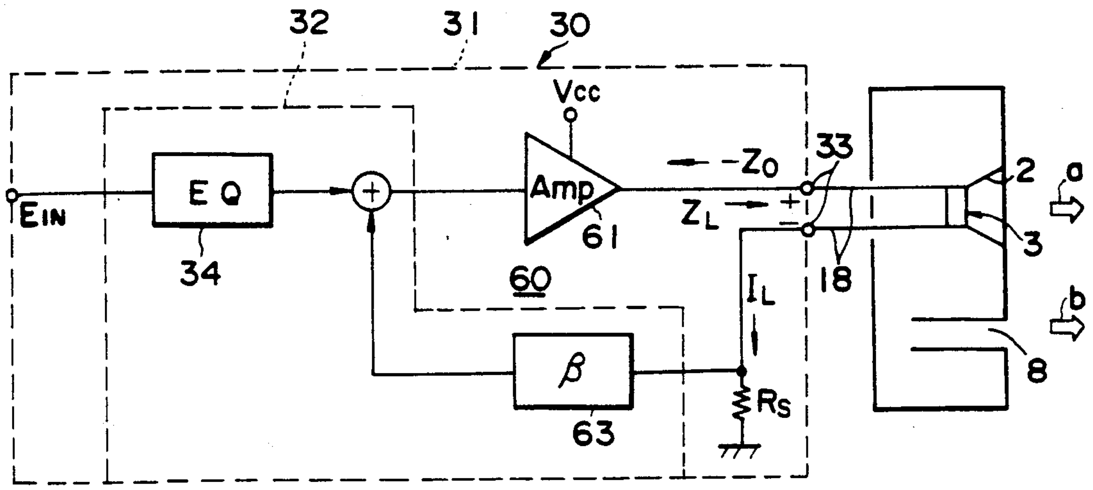
FIG. 2 is a circuit diagram for explaining a circuit arrangement of the driving apparatus shown in FIG. 1.

FIG. 1 shows the outer appearance and overall arrangement of a driving apparatus according to a first embodiment of the present invention, and FIG. 2 shows its basic circuit arrangement. In FIG. 1, a connector (jack) 12 and a main-body circuit board 13 shown in detail in FIG. 2 on which a main-body circuit portion 31 is disposed are housed in a case 11 of a driving apparatus main body 10. Cartridges 15 (15A, 15B, . . . ) are prepared in correspondence with speaker systems 21 (21A, 21B, . . . ) with resonance ports to be connected to this driving apparatus. Each cartridge 15 houses a connector (plug) 16 connectable to the connector 12 and a cartridge circuit board 17 provided with a cartridge circuit portion 32 shown in detail in FIG. 2. Each of the connectors 12 and 16 is provided with four contacts for connecting a power supply $V_{CC}$, an electrical signal input $E_{IN}$, a speaker negative terminal (−), and a common line GND between the main-body circuit board 13 and the cartridge circuit board 17.

When this driving apparatus is used, a desired one of the speaker systems 21A, 21B, . . . is connected to output terminals 33 of the main-body circuit portion 31 by a connection cord 18, a corresponding one of the cartridges 15 (one of the cartridge 15A for the speaker system 21A, the cartridge 15B for the speaker system 21B, . . . ) is set in the driving apparatus main body 10, and the connector 12 of the main-body circuit board 13 is connected to the connector 16 of the cartridge circuit board 17. Thus, a driver circuit 30 whose drive characteristic values are set to be optimal values with respect to the selected speaker system 21 and which includes an equalizer circuit 34 and a negative impedance circuit 60 shown in FIG. 2 is formed.

FIG. 2 shows an arrangement of an acoustic apparatus in which a speaker system with a resonance port similar to a conventional bass-reflex speaker system is driven using a negative impedance generator disclosed in the above-mentioned U.S. patent application Ser. No. 286,869 of the same assignee. In the driver circuit 30 shown in the Figure, the negative impedance driver 60 comprises a amplifier 61, resistor $R_S$, and feedback circuit 63.

In the negative impedance driver 60, an output from an amplifier 61 having a gain A is supplied to a speaker unit 3 as a load $Z_L$ through the output terminal 33 and the connection cord 18. A current $I_L$ flowing through the speaker unit 3 is detected, and the detected current is positively fed back to the amplifier 61 through the feedback circuit 63 having a transmission gain $\beta$. With this arrangement, an output impedance $Z_0$ of the circuit is calculated as:

$$Z_0 = R_S(1 - A\beta)$$

If $A\beta > 1$ is established in this equation, $Z_0$ becomes an open stable type negative resistance.

Figure 3:
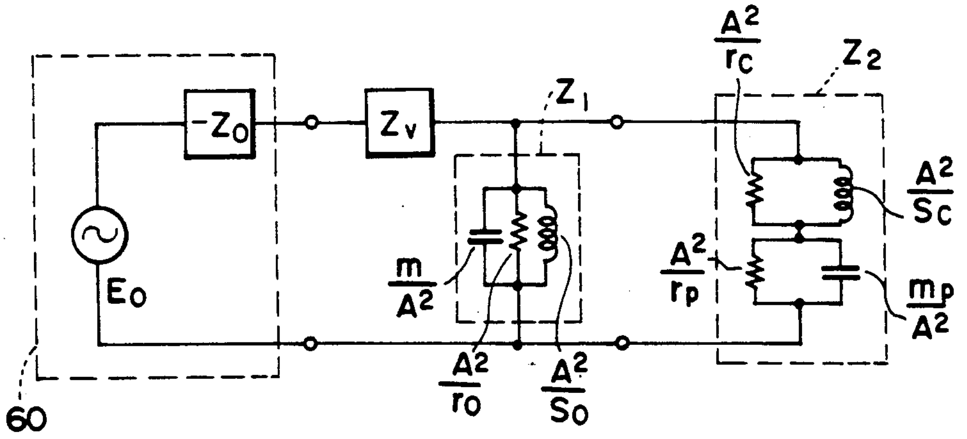
FIG. 3 is an electric equivalent circuit diagram of an acoustic apparatus shown in FIGS. 1 and 2.

FIG. 3 shows an arrangement of an electric equivalent circuit of the portion comprising the speaker system with resonance port shown in FIG. 1 and the negative impedance driver 60 shown in FIG. 2. In FIG. 3, a parallel resonance circuit $Z_1$ is formed by the equivalent motional impedance of the speaker unit 3. In this circuit, reference symbol $r_o$ denotes an equivalent resistance of the vibration system of the speaker unit 3; $S_o$, an equivalent stiffness of the vibration system; and $m_o$, an equivalent mass of the vibration system. A series resonance circuit $Z_2$ is formed by an equivalent motional impedance of a Helmholtz resonator constituted by the resonance port 8 and the cabinet 1. In this circuit, reference symbol $r_c$ denotes an equivalent resistance of the cavity of the resonator; $S_c$, an equivalent stiffness of the cavity; $r_p$, an equivalent resistance of the resonance port 8; and $m_p$, an equivalent mass of the resonance port 8. In the Figure, reference symbol A denotes a force coefficient. When the speaker unit 3 is a dynamic direct radiation speaker unit, $A = Bl_v$ where B is the magnetic flux density in a magnetic gap, and $l_v$ is the total length of a voice coil conductor. In the Figure, reference symbol $Z_V$ denotes an internal impedance (non-motional impedance) of the speaker unit 3. When the speaker unit 3 is a dynamic direct radiation speaker unit, the impedance $Z_V$ mainly comprises a resistance $R_V$ of the voice coil, and includes a small inductance.

The operation of the acoustic apparatus having the arrangement shown in FIGS. 1 and 2 will be described below.

When a drive signal is supplied from the driver circuit 30 having a negative impedance drive function to the speaker unit 3, the speaker unit 3 electromechanically converts this signal to reciprocate its diaphragm 2 forward and backward (to the left and right in FIG. 2). The diaphragm 2 mechano-acoustically converts the reciprocal motion. Since the driver circuit 30 has the negative impedance drive function, the internal impedance of the speaker unit 3 is equivalently decreased (ideally invalidated). Therefore, the speaker unit 3 drives the diaphragm 2 while faithfully responding to the drive signal input to the driver circuit 30, and independently supplies drive energy to the Helmholtz resonator constituted by the resonance port 8 and the cabinet 1. In this case, the front surface side (the right surface side in FIG. 2) of the diaphragm 2 serves as a direct radiator portion for directly radiating acoustic wave to the outward, and the rear surface side (the left surface side in FIG. 2) of the diaphragm 2 serves as a resonator driver portion for driving the Helmholtz resonator constituted by the resonance port 8 and the cabinet 1.

Figure 4:
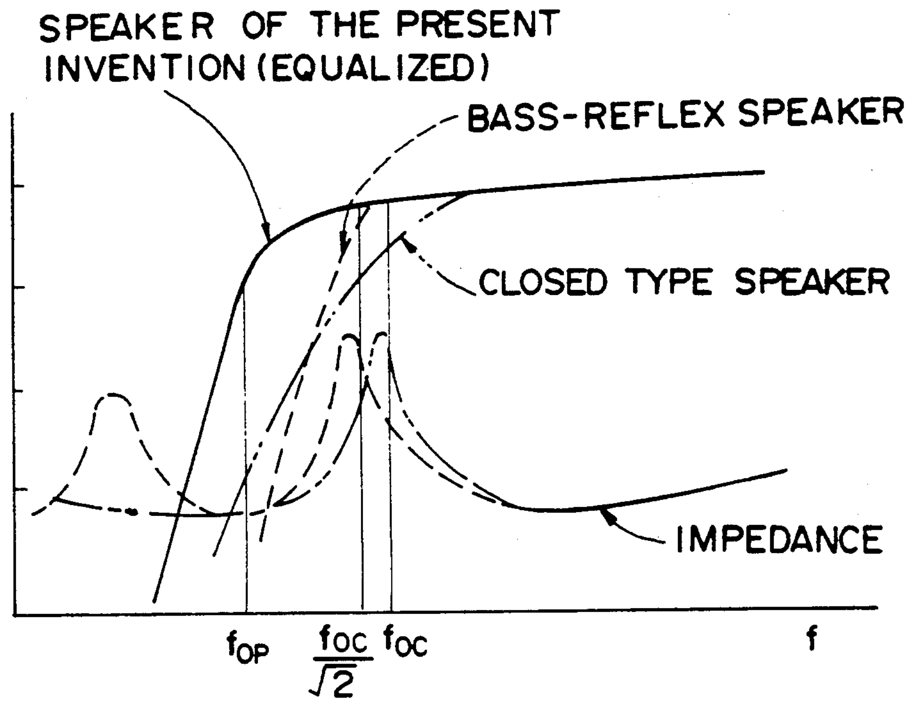
FIG. 4 is a graph showing sound pressure-frequency characteristics of an acoustic wave radiated from the acoustic apparatus shown in FIGS. 1 and 2.

For this reason, as indicated by an arrow a in the Figure, an acoustic wave is directly radiated from the diaphragm 2, and air in the cabinet 1 is resonated, so that an acoustic wave having a sufficient sound pressure is resonantly radiated from the resonance radiation portion (the opening portion of the resonance port 8), as indicated by an arrow b in the Figure. By adjusting an air equivalent mass in the resonance port 8 of the Helmholtz resonator, the resonance frequency $f_{op}'$ is set to be lower than the Helmholtz resonance frequency $f_{op}(=f_{oc}/\sqrt{2})$ of the conventional system shown in FIG. 16, and by adjusting the equivalent resistance of the resonance port 8, the Q value is set to be an appropriate level, so that a sound pressure of an appropriate level can be obtained from said opening portion of the resonance port 8. By these adjustments and by increasing/decreasing the signal level input to the driver circuit, sound pressure-frequency characteristics shown by, for example, solid lines in FIG. 4 can be obtained. Note that, in FIG. 4, alternate one long and two dashed lines represent a frequency characteristic and a impedance characteristic of conventional closed type speaker system, and dotted lines represent a frequency characteristic and a impedance characteristic of conventional bass-reflex type speaker system.

An operation when a speaker system utilizing the Helmholtz resonator is driven by a negative impedance will be described below.

Figure 5:
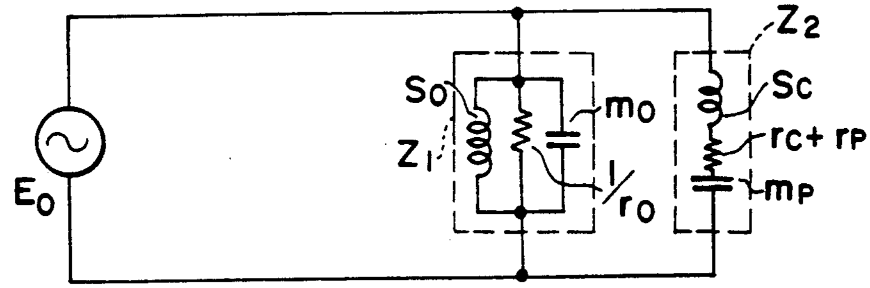
FIG. 5 is an equivalent circuit diagram when $Z_V - Z_0 = 0$ in FIG. 3.

FIG. 5 shows an electrically equivalent circuit when $Z_V - Z_0 = 0$ in FIG. 3, i.e., when the internal impedance (non-motional impedance) of a speaker unit 3 is equivalently completely invalidated. In FIG. 5, coefficients suffixed to values of respective components are omitted.

The equivalent circuit diagram reveals the following facts.

The two ends of the parallel resonance circuit $Z_1$ formed by the equivalent motional impedance of the speaker unit 3 are short-circuited at a zero impedance in an AC manner. Therefore, the parallel resonance circuit $Z_1$ has a Q value of 0, and can no longer serve as a resonance circuit. More specifically, this speaker unit 3 loses the concept of a lowest resonance frequency which is present in a state wherein the speaker unit 3 is merely mounted on the Helmholtz resonator. In the following description, the lowest resonance frequency $f_0$ or equivalent of the speaker unit 3 merely means the essentially invalidated concept. In this manner, since the unit vibration system (parallel resonance circuit) $Z_1$ does not essentially serve as a resonance circuit, the resonance system in this acoustic apparatus is only the Helmholtz resonance system (series resonance circuit) $Z_2$.

Since the speaker unit 3 does not essentially serve as the resonance circuit, it linearly responds to a drive signal input in real time, and faithfully electro-mechanically converts an electrical input signal (drive signal $E_0$) without transient response, thus displacing the diaphragm 2. That is, a perfect damped state (so-called "speaker dead" state) is achieved. The output sound pressure-frequency characteristics around the lowest resonance frequency $f_0$ or equivalent of this speaker in this state are 6 dB/oct. Contrary to this, characteristics of a normal voltage drive state are 12 dB/oct.

The series resonance circuit $Z_2$ formed by the equivalent motional impedance of the Helmholtz resonator is connected to the drive signal source $E_0$ at a zero impedance. Thus, the circuit $Z_2$ no longer has a mutual dependency with the parallel resonance circuit $Z_1$. Thus, the parallel resonance circuit $Z_1$ and the series resonance circuit $Z_2$ are present independently of each other. Therefore, the volume (in inverse proportion to $S_c$) of the cabinet 1, and the shape and dimension (in proportion to $m_p$) of the resonance port 8 do not adversely influence the direct radiation characteristics of the speaker unit 3. The resonance frequency and the Q value of the Helmholtz resonator are not influenced by the equivalent motional impedance of the speaker unit 3. More specifically, the characteristic values ($f_{op}$, $Q_{op}$) of the Helmholtz resonator and the characteristic values ($f_o$, $Q_o$) of the speaker unit 3 can be independently set. Furthermore, the series resistance of the series resonance circuit $Z_2$ is only $r_c + r_p$, and these resistances are sufficiently small values, as described above. Thus, the Q value of the series resonance circuit $Z_2$, i.e., the Helmholtz resonator can be set to be sufficiently high.

From another point of view, since the unit vibration system does not essentially serve as a resonance system, the diaphragm 2 of the speaker unit 3 is displaced according to a drive signal input $E_0$, and is not influenced by an external force, in particular, an air counteraction caused by the equivalent stiffness $S_c$ of the cabinet. For this reason, the diaphragm 2 equivalently serves as a wall when viewed from the cabinet side, and the presence of the speaker unit 3 when viewed from the Helmholtz resonator is invalidated. Therefore, the resonance frequency $f_{op}$ and the Q value $Q_{op}$ of the Helmholtz resonator do not depend on the impedance inherent in the speaker unit 3. Even when the resonance frequency is set to be a value so that the Q value is considerably decreased in a conventional drive method, the Q value can be maintained to be a sufficiently large value. The Helmholtz resonance system is present as a virtual speaker which performs acoustic radiation quite independently of the unit vibration system. Although the virtual speaker is realized by a small diameter corresponding to the port diameter, it corresponds to one having a considerably large diameter as an actual speaker in view of its bass sound reproduction power.

Figure 16:
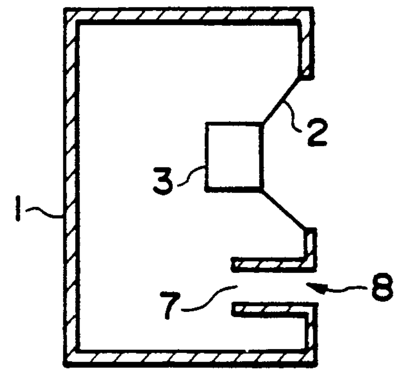
FIG.16 PRIOR ART
FIG. 16 is a sectional view showing an arrangement of a conventional bass-reflex speaker system.
Figure 17:
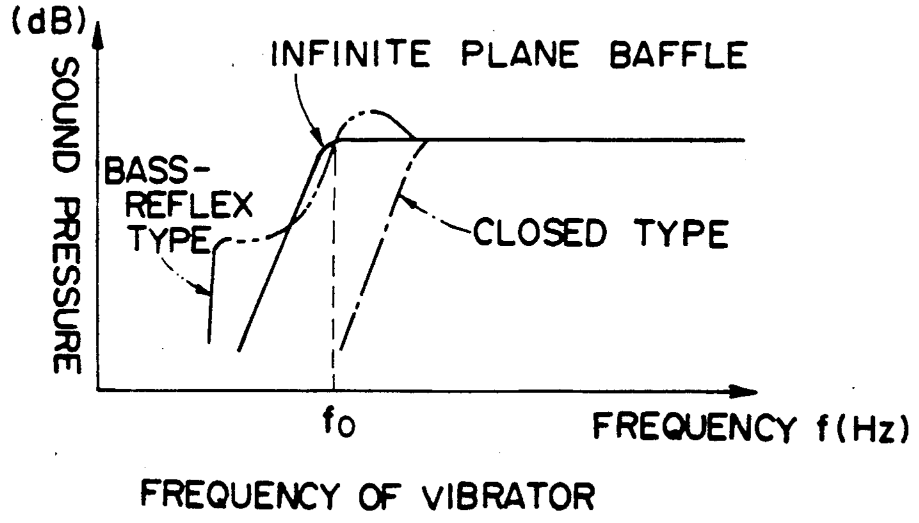
FIG. 17 is a graph for explaining sound pressure characteristics of the speaker systems shown in FIGS. 15 and 16.
Figure 18A:
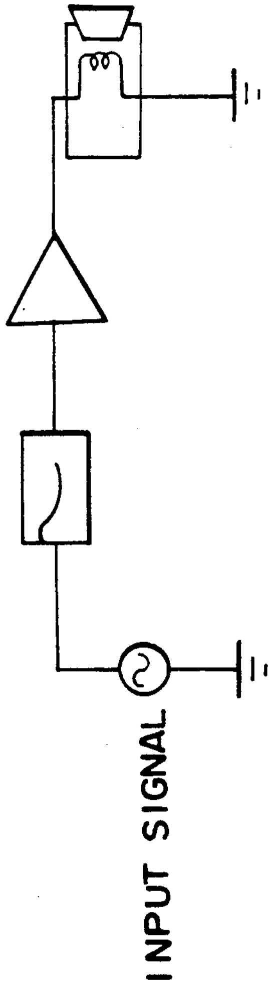
FIGS. 18(*a*), 18(*b*), 18(*c*) and 18(*d*) are diagrams and graphs for explaining a circuit and frequency characteristics when a speaker unit attached to a compact cabinet is constant-voltage driven by a bass-tone boosted signal.
Figure 18B:
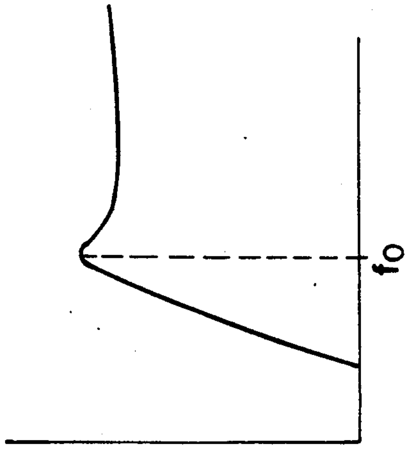
Figure 18C:
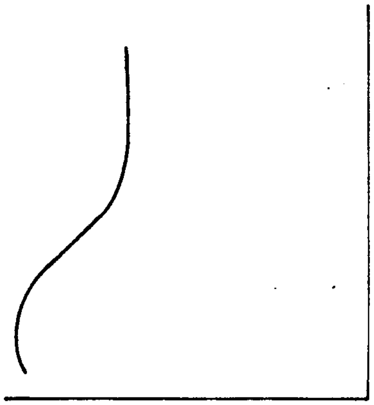
Figure 18D:
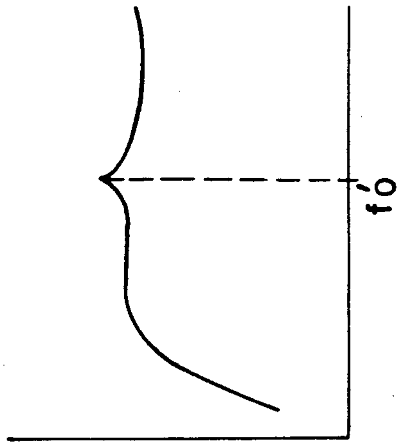
Figure 19:
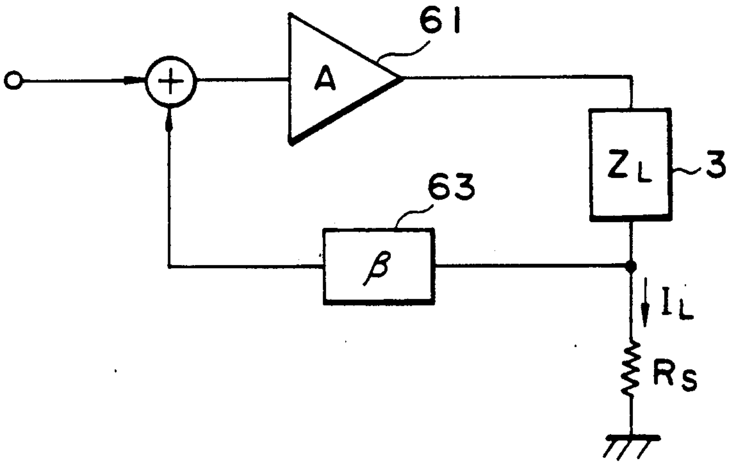
FIG. 19 is a basic circuit diagram of a negative impedance generator according to a prior application.

The system and apparatus of the present invention described above will be compared with a conventional system wherein a bass-reflex speaker system shown in FIG. 16 is driven by an ordinary power amplifier. In the conventional system, as is well known, a plurality of resonance systems, i.e., the unit vibration system $Z_1$ and the Helmholtz resonance system $Z_2$, are present, and the resonance frequencies and the Q values of the resonance systems closely depend on each other. For example, if the resonance port is elongated or its diameter is reduced ($m_p$ is increased) to decrease the resonance frequency of the Helmholtz resonance system $Z_2$, the Q value of the unit vibration system $Z_1$ is increased and the Q value of the Helmholtz resonance system $Z_2$ is decreased. If the volume of the cabinet is decreased ($S_c$ is increased), the Q value and the resonance frequency of the unit vibration system $Z_1$ are increased, and the Q value of the Helmholtz resonance system $Z_2$ is further decreased even if the resonance frequency of the Helmholtz resonance system Z2 is kept constant by elongating the port or decreasing its diameter. More specifically, since the output sound pressure-frequency characteristics of the speaker system are closely related to the volume of the cabinet and the dimensions of the port, a high-grade design technique is required to match them. Thus, it is generally not considered that a cabinet (or system) can be made compact in size without impairing the frequency characteristics of an output sound pressure, in particular, a bass range characteristics, and that an acoustic reproduction range can easily be expanded by an existing speaker system driven by any conventional driving system without impairing a sound quality. The relationship between the frequency lower than the resonance frequency and a resonance acoustic radiation power in the Helmholtz resonance system $Z_2$ is decreased at a rate of 12 dB/oct with respect to a decrease in frequency when viewed from the sound pressure level. Thus, when the resonance frequency is set to be extremely lower than that of the basic concept of the bass-reflex speaker system, correction by increasing/decreasing an input signal level is very difficult to achieve.

In the apparatus of the first embodiment, as described above, since the speaker system utilizing Helmholtz resonance is driven by a negative impedance, the characteristics, dimensions, and the like of the unit vibration system and the Helmholtz resonance system can be independently set. In addition, even if the resonance frequency of the Helmholtz resonance system is set to be low, the large Q value and the high bass sound reproduction power can be maintained, and the resonator drive power of the unit vibration system can be increased (6 dB/oct). Therefore, nonuniformity of the frequency characteristics can be advantageously corrected by increasing/decreasing an input signal level like in normal sound quality control. For this reason, a cabinet can be rendered compact and speaker system can be made compact in size without impairing a frequency characteristics and a sound quality. In addition, the sound quality can be improved or the acoustic reproduction range, in particular, a bass sound range, can be easily expanded by driving an existing speaker system, as compared with the case wherein the speaker system is driven by a conventional constant-voltage driving system.

In the above description, the case of $Z_V - Z_0 = 0$ has been exemplified. However, the present invention includes a case of $Z_V - Z_0 > 0$ if $-Z_0 < 0$. In this case, the characteristic values and the like of the unit vibration system and the Helmholtz resonance system become intermediate values between the case of $Z_V - Z_0 = 0$ and the case of the conventional constant voltage drive system. Therefore, by positively utilizing this nature, the Q value of the Helmholtz resonance system can be adjusted by adjusting the negative impedance $-Z_0$ instead of adjusting the port diameter or inserting a mechanical Q damper such as glass wool or felt in the cabinet.

In conventional systems, it is very difficult for many users to appropriately set an output impedance or to appropriately set an increase/decrease in input signal level by a variable resistor, a switch, or the like. In this embodiment, however, as shown in FIG. 1. transmission characteristics of a feedback circuit 63 are changed by setting or exchanging the cartridge to set a negative impedance value $-Z_0$ or the like suitable for a system to be driven. Therefore, the negative impedance value $-Z_0$ can be very easily set to be an optimal value.

Note that the closed speaker system corresponds to a system obtained by removing a resonance port of the speaker system with the resonance port described above, and hence, can be considered as a system in which an equivalent mass $m_p$ of the resonance port is set to be $\infty$, i.e., a capacitor $m_p/A^2$ is short-circuited in the equivalent circuits shown in FIGS. 3 and 5. More specifically, when a closed speaker system is driven by a power amplifier whose output impedance includes a negative impedance, and an input signal level of the power amplifier is increased/decreased, reproduction of relatively high sound quality can be realized up to a value near the lowest resonance frequency $f_0$ or equivalent of the speaker unit regardless of the volume of a cabinet.

Figure 6:
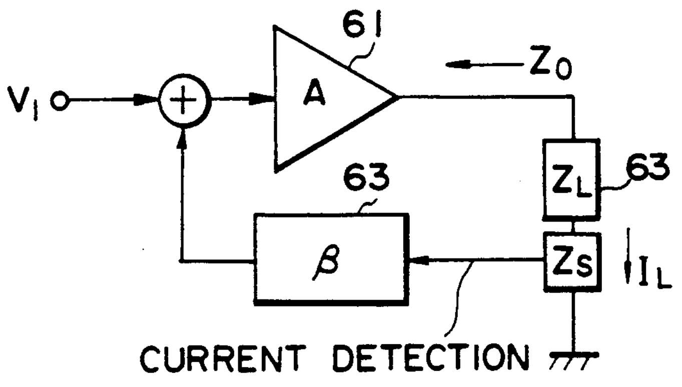
FIGS. 6 and 7 are basic circuit diagrams of a circuit for generating a negative impedance.

FIG. 6 shows the basic arrangement of a negative impedance generator for driving a vibrator (speaker unit) by negative impedance.

In the driver circuit 30 shown in the Figure, an output from an amplifier 61 having a gain A is supplied to a load $Z_L$ constituted by a speaker unit 3. A current $I_L$ flowing through the load $Z_L$ is detected, and the detected current is positively fed back to the amplifier 61 through a feedback circuit 63 having a transmission gain $\beta$. Thus, the output impedance $Z_0$ of the circuit is given by:

$$Z_0 = Z_S(1 - A\beta) \tag{4}$$

From equation (4), If $A > 1$, $Z_0$ is an open stable type negative impedance. In the equation, $Z_S$ is the impedance of a sensor for detecting the current.

Therefore, in the circuit shown in FIG. 6, the type of impedance $Z_S$ is appropriately selected, so that the output impedance can include a desired negative impedance component. For example, when the current $I_L$ is detected by a voltage across the two end of the impedance $Z_S$, if the impedance $Z_S$ is a resistance $R_S$, the negative impedance component is a negative resistance component; if the impedance $Z_S$ is an inductance $L_S$, the negative impedance component is a negative inductance component; and if the impedance $Z_S$ is a capacitance $C_S$, the negative impedance component is a negative capacitance component. An integrator is used as the feedback circuit 63, and a voltage across the two end of the inductance $L_S$ as the impedance $Z_S$ is detected by integration, so that the negative impedance component can be a negative resistance component. A differentiator is used as the feedback circuit 63, and a voltage across the two end of the capacitance $C_S$ as the impedance $Z_S$ is detected by differentiation, so that the negative impedance component can be a negative resistance component. As the current detection sensor, a current probe such as a C.T. (current transformer) or a Hall Element can be used in place of, or in addition to these impedance element $R_S$, $L_S$ and $C_S$.

An embodiment of the above-mentioned circuit is described in, e.g., Japanese Patent Publication No. Sho 59-51771.

Figure 7:
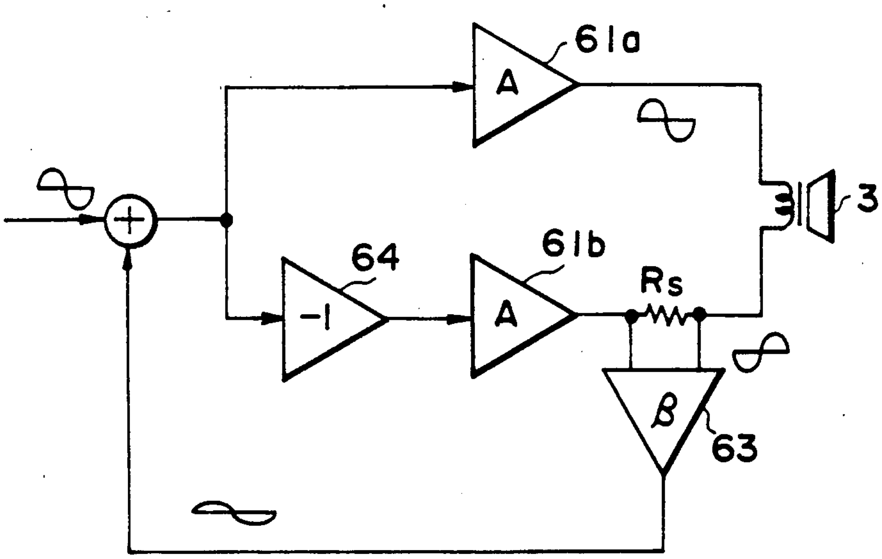

Current detection can be performed at a nonground side of the speaker 3. An embodiment of such a circuit is described in, e.g., Japanese Patent Publication No. Sho 54-33704. FIG. 7 shows a BTL connection. This can be easily applied to the circuit shown in FIG. 6. In FIG. 7, reference numeral 64 denotes an inverter.

Figure 8:
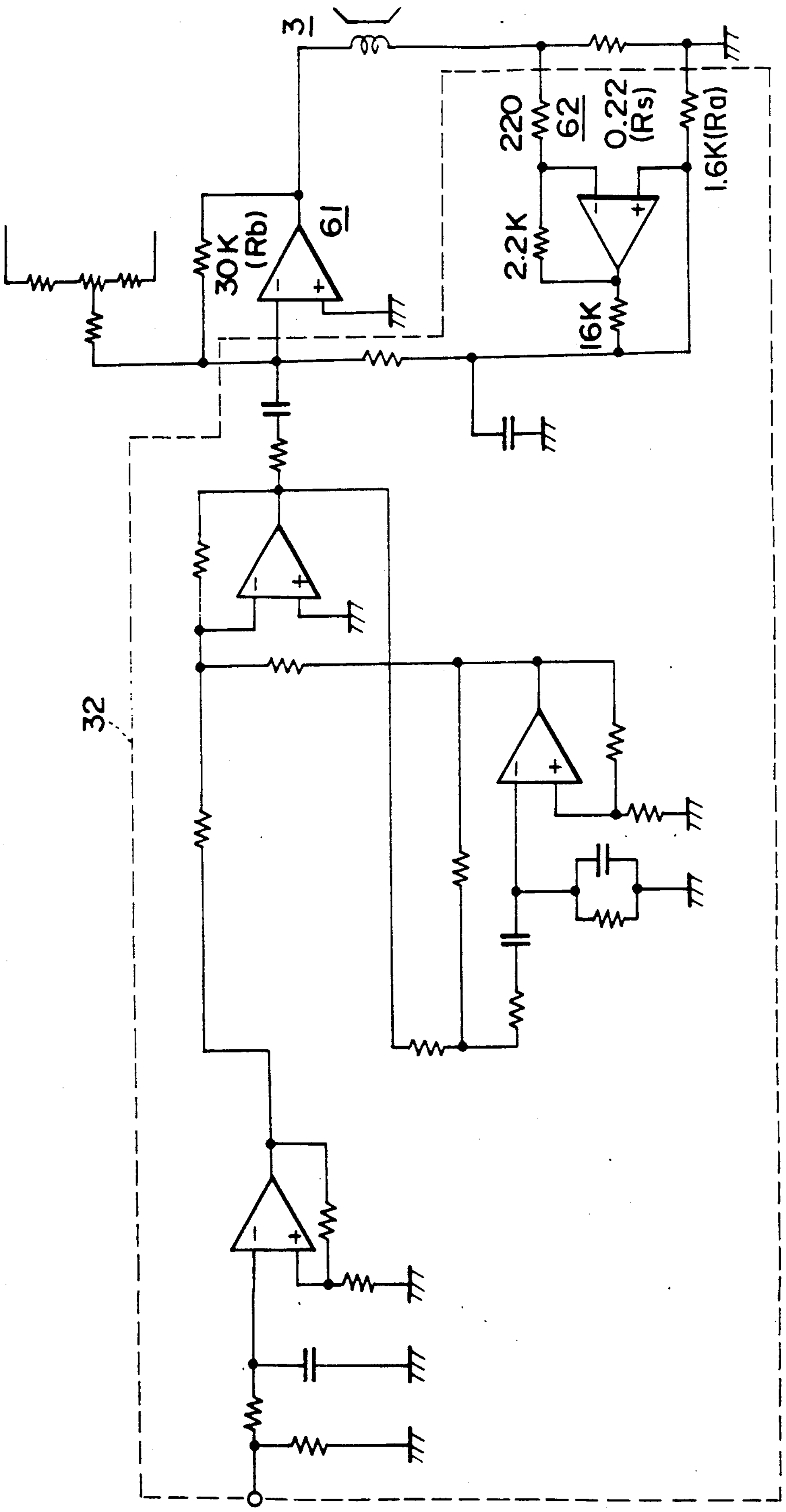
FIG. 8 is a detailed circuit diagram of a negative resistance driving circuit.

FIG. 8 shows a detailed circuit of amplifiers which include a negative resistance component in its output impedance.

The output impedance $Z_0$ in the amplifier shown in FIG. 8 is given by:

$$\begin{aligned} Z_0 &= R_S(1 - R_b/R_a) \\ &= 0.22(1 - 30/1.6) \\ &= -3.9\ (\Omega) \end{aligned}$$

In FIG. 8, a portion 32 surrounded by dotted line corresponds to the cartridge circuit portion 32 shown in FIG. 2.

In the above description, the equalizer circuit 34 and the feedback circuit 63 are entirely separated from the driving apparatus main body 10 and are stored or housed in the cartridge 15 as the control information storage body. The scope of the present invention includes an arrangement wherein the control information storage body stores at least a portion enough to change or set feedback characteristics of the feedback circuit 63.

In the above description, analog circuit information is stored as control information. However, the control information may be digital data. In this case, as the equalizer circuit 34 and the feedback circuit 63, a digital filter is used, and an A/D transducer for converting an output of a current detection element $Z_S$ into digital data is arranged between the feedback circuit 63 and the current detection element $Z_S$. As a control information medium, a ROM or a magnetic or punch card may be used in place of an analog circuit in the above embodiment. When a card is used as the medium, a card reader is arranged in place of the connectors 12 and 16, and a data storage RAM or the like is arranged therein.

Figure 9A:
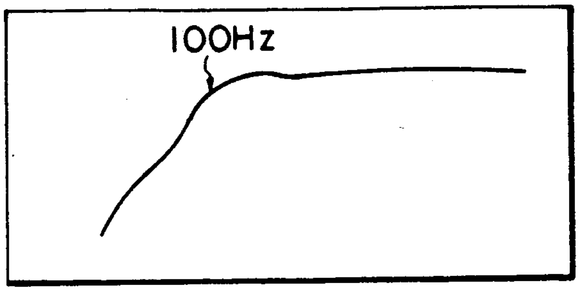
FIGS. 9(*a*) and 9(*b*) are views for explaining a modification of the driving apparatus of FIG. 1.
Figure 9B:
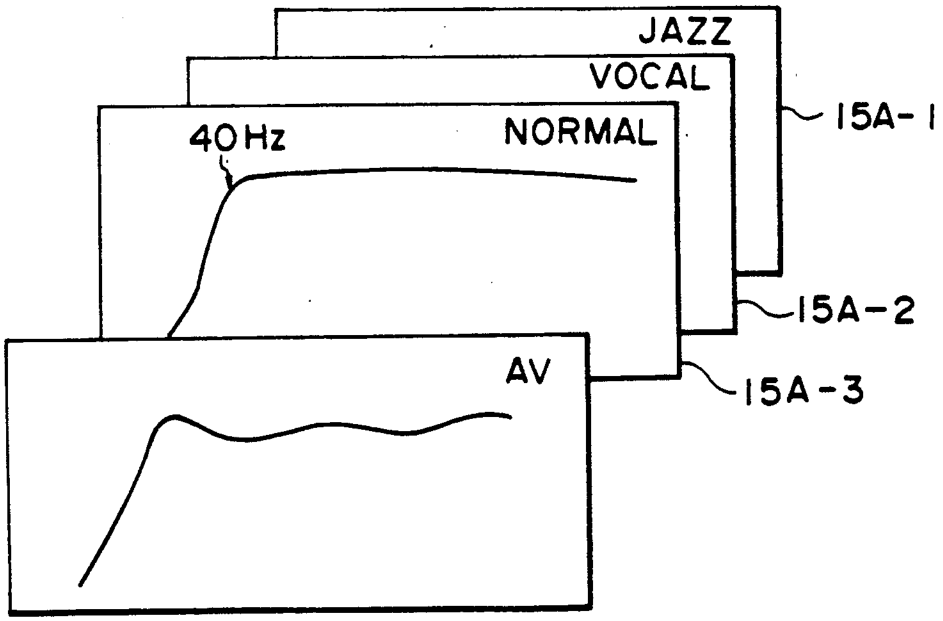

As the cartridges 15A, 15B, . . . , a plurality of types of cartridges 15A-1, 15A-2, . . . having different kinds of control information are prepared in correspondence with one speaker system, e.g., 21A, as shown in FIGS. 9(*a*) and 9(*b*), so that characteristics, e.g., an output impedance, and the like, of the driving apparatus can be set in correspondence with a kind of music to be reproduced, e.g., jazz, classical music, . . . as well as the type of speaker system. FIG. 9(*a*) shows frequency characteristics of a sound pressure output in a constant-voltage driving state, and FIG. 9(*b*) shows frequency characteristics of a sound pressure output when characteristic values of negative impedance driving are set in correspondence with kinds of music.

Second Embodiment

Figure 10:
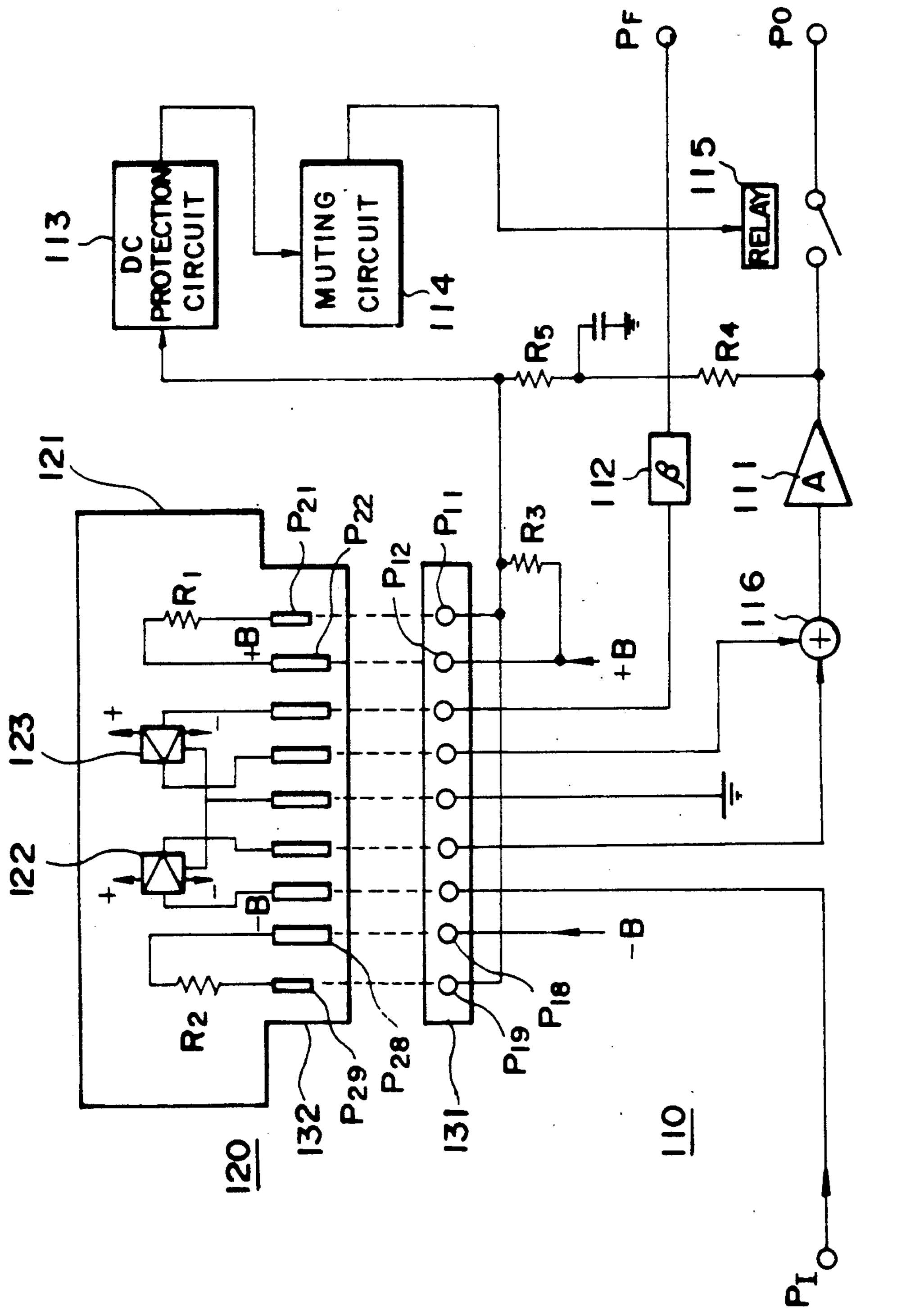
FIG. 10 is a circuit diagram of a driving apparatus according to a second embodiment of the present invention.

FIG. 10 shows the overall arrangement of a driving apparatus (power amplifier) according to a second embodiment of the present invention. In the amplifier shown in FIG. 10, an amplifier main body 110 and a cartridge 120 which are separately formed are coupled (connected) through a connector constituted by a jack 31 disposed on the main body 110 and an insertion terminal portion 132 disposed on the cartridge 120.

The main body 110 comprises a power amplifier 111, a feedback circuit 112, a DC protection circuit 113, a muting circuit 114, a relay 115, the jack 131, and the like. The jack 131 is provided with nine main-body terminals $P_{11}$ to $P_{19}$.

The cartridge 120 comprises a printed circuit board 121; a pre-amplifier 122, a feedback amplifier 123, and the insertion terminal portion 132, which are disposed on the printed circuit board 121; and the like. The insertion terminal portion 132 is formed as a portion of the printed circuit board 121, and nine connection terminals $P_{21}$ to $P_{29}$ are formed as a circuit pattern on the printed circuit board 121.

The insertion terminal portion 132 of the cartridge is inserted in the jack 131 of the main body, and the corresponding terminals $P_{21}$ and $P_{11}$, $P_{22}$ and $P_{12}$, . . . , $P_{29}$ and $P_{19}$ are connected to each other. Thus, the main body 110 and the cartridge 120 are coupled to each other.

Of the connection terminals $P_{21}$ to $P_{29}$ disposed on the cartridge 120, the terminals $P_{21}$ and $P_{29}$ at two ends serve as protection terminals, and have a smaller length than the remaining terminals $P_{22}$ to $P_{28}$. Power supply B+ and B− supply terminals $P_{22}$ and $P_{28}$ from the main body 110 to the cartridge 120 and the protection terminals $P_{21}$ and $P_{29}$ are respectively connected through resistors $R_1$ and $R_2$ in the cartridge 120, as shown in FIG. 10. In the main body 110, the main-body terminals $P_{11}$ and $P_{19}$ are jumper-connected, and a resistor $R_3$ is connected between the power supply B+ terminal $P_{12}$ and a connection node between the terminals $P_{11}$ and $P_{19}$. The connection node is connected to the input of the DC protection circuit 113. The resistance of these resistors $R_1$, $R_2$, and $R_3$ are set to satisfy $R_2=R_1//R_3$.

These resistors $R_1$, $R_2$, and $R_3$ constitute a coupling-/separation protection circuit which forms a DC bias circuit and a power supply voltage dividing circuit in accordance with a separation/coupling state between the main body 110 and the cartridge 120, and which generates a DC voltage according to the state and adds it to the input of the DC protection circuit 113. In the normal operation state of the amplifier, the DC protection circuit 113 turns on the relay 115, so that the output from the power amplifier 111 is supplied to a speaker (not shown) connected to a speaker terminal $P_0$. When the cartridge 120 is separated and the DC voltage is output from the coupling/separation protection circuit, the circuit 113 turns off the relay 115 to cut off a signal power supply to the speaker. Thus, the circuit 113 protects the speaker and the amplifier from an adverse influence caused by an unstable or abnormal operation of the amplifier while the cartridge 120 is separated.

The characteristic feature of the coupling/separation protection circuit of this embodiment is that the muting circuit used upon power-on and the DC protection circuit for protecting the speaker originally equipped in audio equipment are utilized without modification, and the type of cartridge can be identified by resistance without increasing the number of terminals.

A protection circuit of general audio equipment corresponding to the DC protection circuit 113 and the muting circuit 114 shown in FIG. 10 will be described below.

Figure 11:
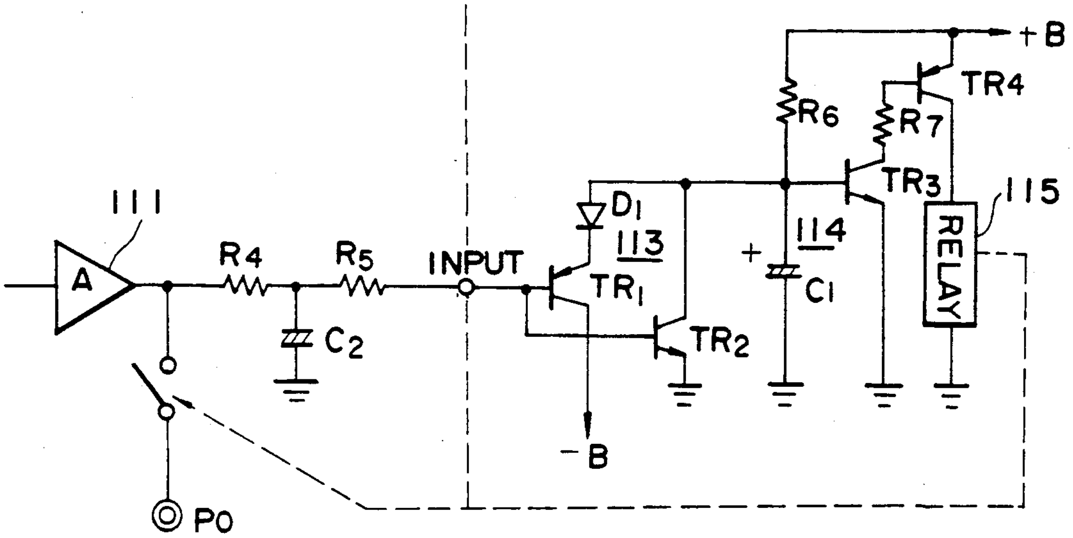
FIG. 11 is a circuit diagram of a protection circuit shown in FIG. 10.

The protection function includes a muting function upon power-on, and a DC protection function for preventing a DC voltage from appearing at the speaker terminal $P_0$. In general, the two functions are operated not independently but in association with each other, and can be consequently realized by turning on/off the relay 115 connected in series with an output circuit. FIG. 11 shows this circuit arrangement.

In the circuit shown in FIG. 11, when a power switch is turned on, a capacitor $C_1$ is charged through a resistor $R_6$. After the lapse of a predetermined period of time, when a terminal voltage of the capacitor $C_1$ exceeds a base-emitter ON voltage ($V_{BE}$=about 0.6 V) of a transistor $TR_3$, the transistor $TR_3$ is turned on, and a collector current of this transistor $TR_3$ becomes a base current through a resistor $R_7$, thus turning on a transistor $TR_4$. The relay 115 is energized and turned on. A predetermined period of time after power-on until the relay 115 is turned on is a muting time upon power-on, and the resistance of the resistor $R_6$ and the capacitance of the capacitor $C_1$ are normally set so that the muting time is 2 to 5 sec.

As an output from the power amplifier 111, an acoustic signal (AC) such as a music signal or the like is output. When a DC voltage appears as this output due to a malfunction of equipment, a speaker as a load may be destroyed. For this reason, a DC component of the output from the power amplifier 111 must be detected to turn off the relay 115. The DC protection circuit 113 constituted by a transistor $TR_1$, a diode $D_1$, and a transistor $TR_2$ is arranged for this purpose. In the circuit shown in FIG. 11, the output from the power amplifier 111 is applied to a capacitor $C_2$ through a resistor $R_4$. since an AC component bypasses to a ground potential side through the capacitor $C_2$, a voltage according to the DC component of the output from the power amplifier 111 appears across the capacitor $C_2$. A time constant defined by the resistor $R_4$ and the capacitor $C_2$ is selected below an audible range. The voltage appearing across the capacitor $C_2$ is input to the DC protection circuit 113 through a resistor $R_5$.

When a voltage higher than the base-emitter ON voltage ($V_{BE}$; e.g., +0.6 V) of the transistor $TR_2$ is applied to the input of the DC protection circuit 113, the transistor $TR_2$ is turned on, and a charge stored on the capacitor $C_1$ is discharged, thus turning off the relay 115. When a voltage obtained by subtracting the ON voltage ($V_f$; e.g., 0.6 V) of the diode $D_1$ and the emitter-base ON voltage ($V_{EB}$; e.g., 0.6 V) from the base-emitter ON voltage of transistor $TR_3$ and lower than −0.6 V is applied to the input of the DC protection circuit 113, the transistor $TR_1$ and the diode $D_1$ are electrically connected to discharge the capacitor $C_1$, and hence, the relay 115 is turned off. Thus, the DC protection circuit 113 turns on the relay 115 when the input voltage falls within the range of −0.6 V to +0.6 V, and turns off the relay 115 when the input voltage falls outside this range.

An operation time when the relay 115 is turned off is determined by a response time of the relay 115. Once the relay 115 is turned off, if a DC input voltage to the DC protection circuit 113 is set to be zero, the relay 115 is turned on not immediately but after a delay time, i.e., the above-mentioned muting time in which the capacitor $C_1$ is charged to the base-emitter ON voltage $V_{BE}$ of the transistor $TR_3$ through the resistor $R_6$.

The operation of the separation/coupling protection circuit in the circuit shown in FIG. 10 will be described below with reference to FIG. 12.

When the cartridge 120 is disengaged (separated), an output voltage $V_1$ of the separation/coupling protection circuit becomes $V_1$=+B by the resistor $R_3$, and is input to the DC protection circuit. Thus, the relay 115 is not turned on. In this case, the separation/coupling protection circuit forms the DC bias circuit consisting of only the resistor $R_3$, and adding a DC voltage to the input of the DC protection circuit.

When the cartridge 120 is inserted, the output voltage $V_1$ becomes a value obtained by voltage-dividing a potential difference between the power supplies +B and −B by the resistors $R_2$ and $R_1//R_3$. In this case, since $R_2=R_1//R_3$, $V_1\approx 0$ V, and the relay 115 is turned on after the lapse of a predetermined period of time (muting time) determined by the protection circuit of the main body.

When control information stored in the cartridge 120 is an analog circuit, large transient noise is initially generated upon insertion of the cartridge 120. A given time is required until this is converged to a steady state. Thus, an output of the apparatus (speaker output in the case of the power amplifier) is disabled for a while after the cartridge 120 is inserted, and must be generated after the transient noise disappears. This operation is the same as power-on muting of a normal amplifier. Noise is also generated when the cartridge 120 is disengaged. In this case, the output must be disabled before the contacts of the connector are disconnected. This can be realized such that the protection terminals of the connector are formed to be shorter than the remaining signal and power supply terminals and are disconnected earlier than the remaining terminals. Although a countermeasure when the cartridge is disengaged can be taken by the connector itself, muting when it is inserted must be separately performed.

In the amplifier shown in FIG. 10, when the cartridge 120 is inserted, the muting circuit 114 is operated in the same manner as upon power-on. Therefore, the muting time is set to be longer than a time required until noise upon power-on disappears and a time required until the transient noise generated when the cartridge is inserted disappears, so that transient noise generated when the cartridge 120 is inserted can be prevented.

Since the connection terminals $P_{21}$ and $P_{29}$ are formed to be shorter than the remaining terminals, when the cartridge 120 is disengaged, the terminals $P_{21}$ and $P_{29}$ are disconnected from the terminals $P_{11}$ and $P_{19}$ before the remaining terminals are disconnected and noise is generated, and the output $V_1$ of the separation/coupling protection circuit becomes not zero, thus turning off the relay 115. Therefore, when noise is generated upon disconnection of the cartridge 120, the relay 115 is already turned off. Thus, the noise at that time can be prevented from being output from the speaker.

When the cartridge is obliquely disengaged and one of the terminals $P_{21}$ and $P_{29}$ is disconnected earlier, e.g., when only the terminal $P_{21}$ is disconnected earlier, the voltage $V_1$ is determined by the resistors $R_3$ and $R_2$, and $R_2<R_3$ since $R_2\approx R_1//R_3$. Therefore, the voltage $V_1$ becomes a negative voltage. When the resistances of the resistors $R_3$ and $R_2$ are set so that the negative voltage is lower than −0.6 V, a protection operation can function. When only the terminal $P_{29}$ is disconnected, since the voltage $V_1$ becomes +B, the protection operation can function.

In general, easy setting is made when $R_1=R_3=2R_2$. In this case, assuming $E_1=E_2=12$ V, $V_1=+12$ V when the cartridge 120 is absent and when only the terminal $P_{29}$ is disconnected, and $V_1=-4$ V when only the terminal $P_{21}$ is disconnected Thus, the protection operation can satisfactorily function.

In this manner, when $E_1=E_2$, if the resistances $R_1=R_3=2R_2$, the object of the present invention can be substantially achieved. In this case, the number of combinations or resistances satisfying this relation is infinite. Furthermore, if $E_1\neq E_2$, a margin can be increased. Even if $E_1\approx E_2$ and $R_1=R_3=2R_2$, a margin of the resistances itself is high.

Figure 12:
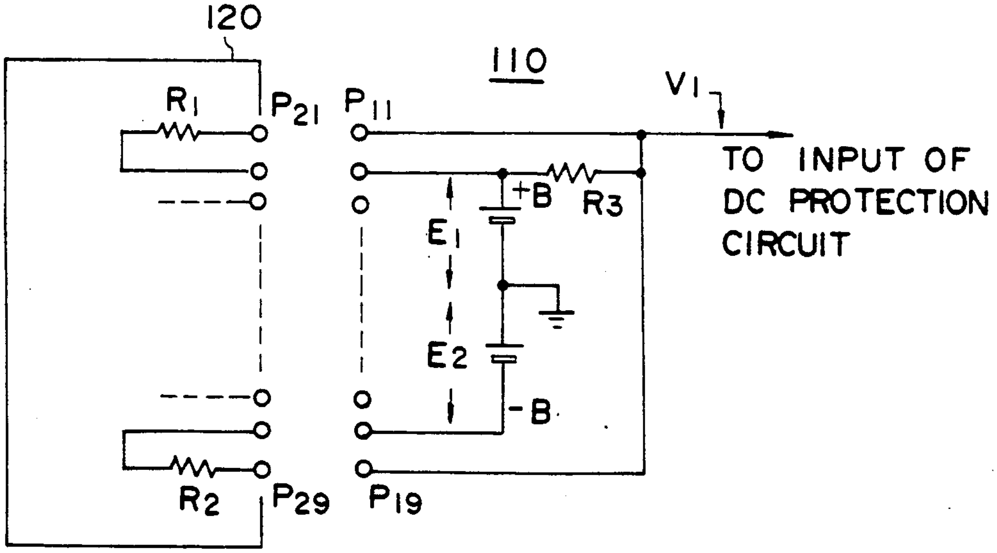
FIG. 12 is a diagram for explaining an operation of the driving apparatus shown in FIG. 10.

In FIG. 12, if the resistance $R_5$ is ignored the output voltage $V_1$ of the separation/coupling protection circuit when the cartridge 120 is inserted is given by:

$$V_1=\frac{R_2E_1-(R_1//R_3)E_2}{R_2+R_1//R_3}$$

An output voltage $V_1'$ when only the connection terminal $P_{21}$ is disconnected is given by:

$$V_1'=\frac{R_2E_1-R_3E_2}{R_2+R_3}$$

An output voltage $V_1''$ when only the connection terminal $P_{29}$ is disconnected is given by $V_1''=E_1$. Therefore, the resistances can be set to yield $V_1\approx 0$ and $V_1'\approx 0$.

In this manner, a cartridge can be identified using only two protection terminals while taking an advantage of a high selection margin of the resistors $R_1$, $R_2$, and $R_3$. In a conventional apparatus, in addition to the protection terminals, another terminal is required to identify a cartridge, and a large number of terminals are required.

For example, assume that a main body A matches with a cartridge a, a main body B matches with a cartridge b, and there is no compatibility therebetween. Under the assumption that $E_1=E_2=12$ V, if a system constituted by the main body A and the cartridge a is set to have $R_1=R_3=2R_2=10$ kΩ, and a system constituted by the main body B and the cartridge b is set to have $R_1=R_3=2R_2=1$ kΩ, when the cartridge a is inserted in the main body B, since $R_1=10$ kΩ, $R_2=5$ kΩ, and $R_3=1$ kΩ from the above equations, $V_1\approx 3.5$ V, $V_1'=8$ V, and $V_1''=12$ V. Thus, since these voltages are higher than 0.6 V, the transistor $TR_2$ of the DC protection circuit 113 is turned on, and the relay 115 is not turned on. When the cartridge b is inserted in the main body A, since $R_1=1$ kΩ, $R_2=0.5$ kΩ, and $R_3=10$ kΩ from the above equations, $V_1\approx -10$ V, $V_1'\approx -11$ V, and $V1''=12$ V. Thus, since the absolute values of these voltages are than 0.6 V, when $V_1\approx -10$ V and $V_1'\approx -11$ V, the transistor $TR_1$ of the DC protection circuit 113 is turned on, and when $V_1'=12$ V, the transistor $TR_2$ of the DC protection circuit 113 is turned on. In either case, the relay 115 is not turned on.

In this manner, whether or not a combination of the cartridge and the main body can be used can be identified only be setting the resistances.

The amplifier shown in FIG. 10 can be formed as various types of speaker drivers by selecting a signal input to a feedback terminal $P_F$ and a polarity and frequency characteristics of the feedback amplifier 123 of the cartridge 120. For example, a motional signal corresponding to a movement of a vibrating body of a speaker unit is detected by any means and input to the feedback terminal $P_F$, and the polarity of the feedback amplifier 123 is set to be negative, so that the motional signal is negatively fed back to the input side. Thus, a motional feedback (MFB) circuit can be formed. Alternatively, a drive current of a speaker unit is detected and input to the feedback terminal $P_F$, and the polarity of the feedback amplifier 123 is set to be positive, so that the drive current signal is positively fed back to the input side. Thus, a negative impedance circuit can be formed. In this case, the cartridge 120 is constituted as a circuit for canceling an air counteraction against the vibrating body of the speaker unit as a load, e.g., the above mentioned MFB circuit or the negative impedance circuit. The pre-amplifier 122 of the cartridge 120 is preset to have appropriate frequency characteristics as an equalizer amplifier.

As an example of such an amplifier, one using the negative impedance generator shown in FIG. 2 can be exemplified. As an example of the negative impedance generator, ones shown in FIGS. 6 to 8 are known. An amplifier 61 in FIG. 2 corresponds to the power amplifier 111 in FIG. 10, and a feedback circuit 63 corresponds to the feedback circuit 112 and the feedback amplifier 123 in FIG. 10.

Figure 13:
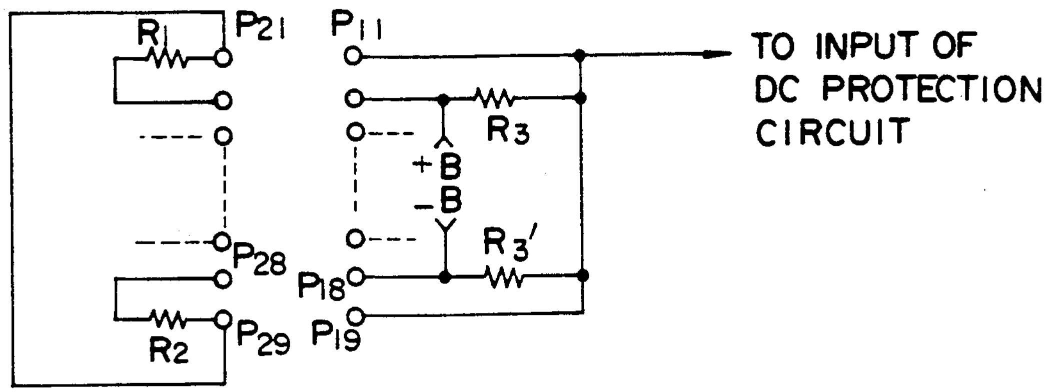
FIGS. 13 and 14 are circuit diagrams of main parts of modifications of the driving apparatus shown in FIG. 10, respectively.

In an amplifier shown in FIG. 13, a bias resistor $R_3'$ is connected between the power supply −B terminal $P_{18}$ and the protection terminal $P_{19}$ to further increase a margin of resistance setting as compared to the amplifier shown in FIG. 10. This amplifier also has the same concept associated with setting of resistances as that in FIG. 10, and the resistances $R_1$, $R_2$, $R_3$, and $R_3'$ are set as follows. When the cartridge is not inserted, a voltage obtained by voltage-dividing a voltage across the power supplies +B and −B by the resistors $R_3$ and $R_3'$ falls outside a range of −0.6 V to +0.6 V in which the relay 115 is turned off in the DC protection circuit 113, i.e., a DC bias voltage falling outside the range is added from this voltage-dividing circuit to the input of the DC protection circuit 113. When the cartridge is inserted, a voltage obtained by voltage-dividing a voltage across the power supplies +B and −B by the resistances $R_1//R_3$ and $R_2//R_3'$ falls within the range of −0.6 V to +0.6 V in which the relay 115 is turned on in the DC protection circuit 113.

Figure 14:
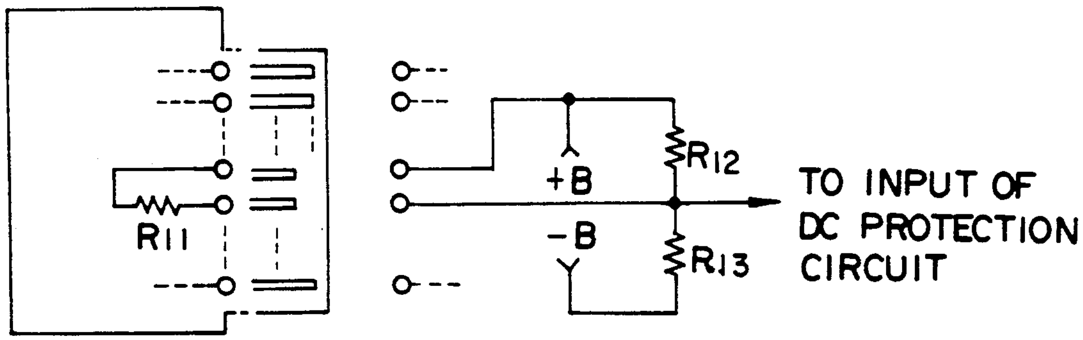
Figure 15:
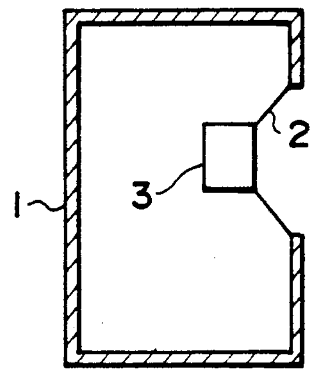
FIG.15 PRIOR ART
FIG. 15 is a sectional view showing an arrangement of a conventional closed type speaker system.

In an amplifier shown in FIG. 14, the protection terminals are selected from terminals other than those at two ends, and one resistor is arranged in the cartridge 120 with respect to the amplifier shown in FIG. 10. In this case, only one terminal need by shorter than the remaining terminals as a protection terminal. In this amplifier, resistances $R_{11}$, $R_{12}$, and $R_{13}$ are set as follows. That is, the voltage $V_1$ obtained by voltage-dividing a voltage across the power supplies +B and −B by the resistors $R_{12}$ and $R_{13}$ satisfies $V_1<-0.6$ V or $+0.6\text{ V}<V_1$ when the cartridge is not inserted, and the voltage $V_1$ obtained by voltage-dividing a voltage across the power supplies +B and −B by the resistors $R_{11}//R_{12}$ and $R_{13}$ satisfies $-0.6\text{ V}<V_1<+0.6$ V when the cartridge is inserted.

Modification of the Embodiment

The present invention is not limited to the above embodiments, and various changes and modifications may be made within the spirit and scope of the invention.

The driver may be any circuit as long as it drives a vibrating body of an electro-acoustic transducer to cancel a counteraction from surrounding portions. For example, the driver may be an MFB circuit as disclosed in Japanese Patent Publication No. Sho 58-31156.

When the output impedance is provided with frequency characteristics, a setting margin of $Q_{oc}'$, $Q_{op}$, and the like can be improved.

What is claimed is:

1. A driving apparatus comprising:

an amplifier main body having an output section in which an output terminal DC voltage in a normal operation state is set to be substantially zero, and DC protection means for, when an absolute value of the output terminal DC voltage exceeds a predetermined voltage, detecting this and cutting off an output from an output terminal;

a control information storage body which is constituted independently of said main body to be selectively separated from and coupled to said main body, as needed, electrical characteristics of the driving apparatus being set in accordance with control information stored in said control information storage body coupled to said main body; and a protection circuit for selectively inhibiting the output from being outputted from the output terminal or permitting the output to be outputted in accordance with separation and coupling states of said control information body;

said protection circuit having:

a DC bias circuit, disposed in said main body, for adding a DC bias voltage to an input voltage of said DC protection means when said control information storage body is separated from said main body; and a power supply voltage dividing circuit, which is constituted by circuit elements including circuit elements constituting said DC bias circuit and separately arranged in said control information storage body and said main body, a plurality of connection terminals of said control information storage body, and corresponding terminals of said main body, and which outputs a voltage of substantially zero in place of the DC bias voltage when said control information storage body is coupled to said main body.

2. A circuit according to claim 1, wherein at least one of the plurality of connection terminals of said control information storage body or said corresponding terminals of said main body forming said power supply voltage dividing circuit is formed to be shorter than other terminals.

* * * * *